US010589552B2

(12) United States Patent
Mergen (10) Patent No.: US 10,589,552 B2
(45) Date of Patent: Mar. 17, 2020

(54) IMAGING DEVICE WITH TRANSLATABLE HINGE PIN (71) Applicant: Hewlett-Packard Development Company, L.P., Houston, TX (US)

(72) Inventor: Benjamin P. Mergen, Vancouver, WA (US)

(73) Assignee: Hewlett-Packard Development Company, L.P., Spring, TX (US)

(*) Notice: Subject to any disclaimer, the term of this patent is extended or adjusted under 35 U.S.C. 154(b) by 0 days.

(21) Appl. No.: 15/748,077

(22) PCT Filed: Oct. 27, 2015

(86) PCT No.: PCT/US2015/057619
§ 371 (c)(1),
(2) Date: Jan. 26, 2018

(87) PCT Pub. No.: WO2017/074322
PCT Pub. Date: May 4, 2017

(65) Prior Publication Data
US 2018/0222230 A1 Aug. 9, 2018

(51) Int. Cl.
B41J 29/13 (2006.01)
E05D 11/06 (2006.01)
(Continued)

(52) U.S. Cl.
CPC ............. B41J 29/13 (2013.01); E05D 3/022 (2013.01); E05D 5/06 (2013.01); E05D 11/06 (2013.01);
(Continued)

(58) Field of Classification Search
CPC . B41J 29/13; E05D 3/022; E05D 5/06; E05D 11/06; E05D 2005/067; H05K 5/0221;
(Continued)

(56) References Cited

U.S. PATENT DOCUMENTS 5,341,542 A 8/1994 Hannan et al.
8,266,765 B2 9/2012 Donoho
(Continued)

FOREIGN PATENT DOCUMENTS

| GB | 2490329 | 10/2012 |
|----|---------|---------|
| KR | 100507526 | 3/2004 |
| WO | WO-2015012830 | 1/2015 |

OTHER PUBLICATIONS

International Search Report and Written Opinion dated Jul. 26, 2016, PCT Patent Application No. PCT/US2015/057619, filed Oct. 27, 2015, Korean Intellectual Property Office.

Primary Examiner — Henok D Legesse
(74) Attorney, Agent, or Firm — Dicke Billig & Czaja PLLC (57) ABSTRACT An imaging device including a housing, an access door, and a flap. The housing forms an interior and forms an access door opening and a slotted connection on a side of the access door opening. The access door includes a door cover, an arm extending from the door cover, and a hinge pin. The hinge pin extends outwardly at a terminal end of the arm and matingly couples with the slotted connection. The hinge pin rotates and translates along a length of the slotted connection. The flap is rotatably extendable over the arm.

19 Claims, 9 Drawing Sheets

(51) Int. Cl.
  *E05D 3/02* (2006.01)
  *E05D 5/06* (2006.01)
  *H05K 5/02* (2006.01)
  *H05K 5/03* (2006.01)
(52) U.S. Cl.
  CPC ......... *H05K 5/0221* (2013.01); *H05K 5/0226* (2013.01); *H05K 5/03* (2013.01); *E05D 2005/067* (2013.01); *E05Y 2201/224* (2013.01); *E05Y 2900/602* (2013.01); *E05Y 2900/606* (2013.01)
(58) Field of Classification Search
  CPC .. H05K 5/0226; H05K 5/03; E05Y 2201/224; E05Y 2900/602; E05Y 2900/606
  See application file for complete search history.

(56) References Cited

U.S. PATENT DOCUMENTS

| | | | |
|---|---|---|---|
| 2004/0114192 A1* | 6/2004 | Jensen | H04N 1/00543 358/296 |
| 2008/0175620 A1 | 7/2008 | Ohta et al. | |
| 2009/0297210 A1 | 12/2009 | Matsumoto | |
| 2011/0304983 A1* | 12/2011 | Senatori | G06F 1/1616 361/679.55 |

* cited by examiner

IMAGING DEVICE WITH TRANSLATABLE HINGE PIN

CLAIM FOR PRIORITY

The present application is a national stage filing under 35 U.S.C. § 371 of PCT application number PCT/US2015/057619, having an international filing date of Oct. 27, 2015, the disclosure of which is hereby incorporated by reference in its entirety.

BACKGROUND

Imaging devices such as printers may be provided with an access door for accessing an interior of the imaging device. Access door travels through a clearance space when moving between closed and open positions. The access door may be impeded from functioning properly and allowing desired access to the interior if the clearance space is occupied.

DETAILED DESCRIPTION

In the following detailed description, reference is made to the accompanying drawings which form a part hereof, and in which is shown by way of illustration specific examples in which the disclosure may be practiced. It is to be understood that other examples may be utilized and structural or logical changes may be made without departing from the scope of the present disclosure. The following detailed description, therefore, is not to be taken in a limiting sense, and the scope of the present disclosure is defined by the appended claims. It is to be understood that features of the various examples described herein may be combined, in part or whole, with each other, unless specifically noted otherwise.

Figure 1:
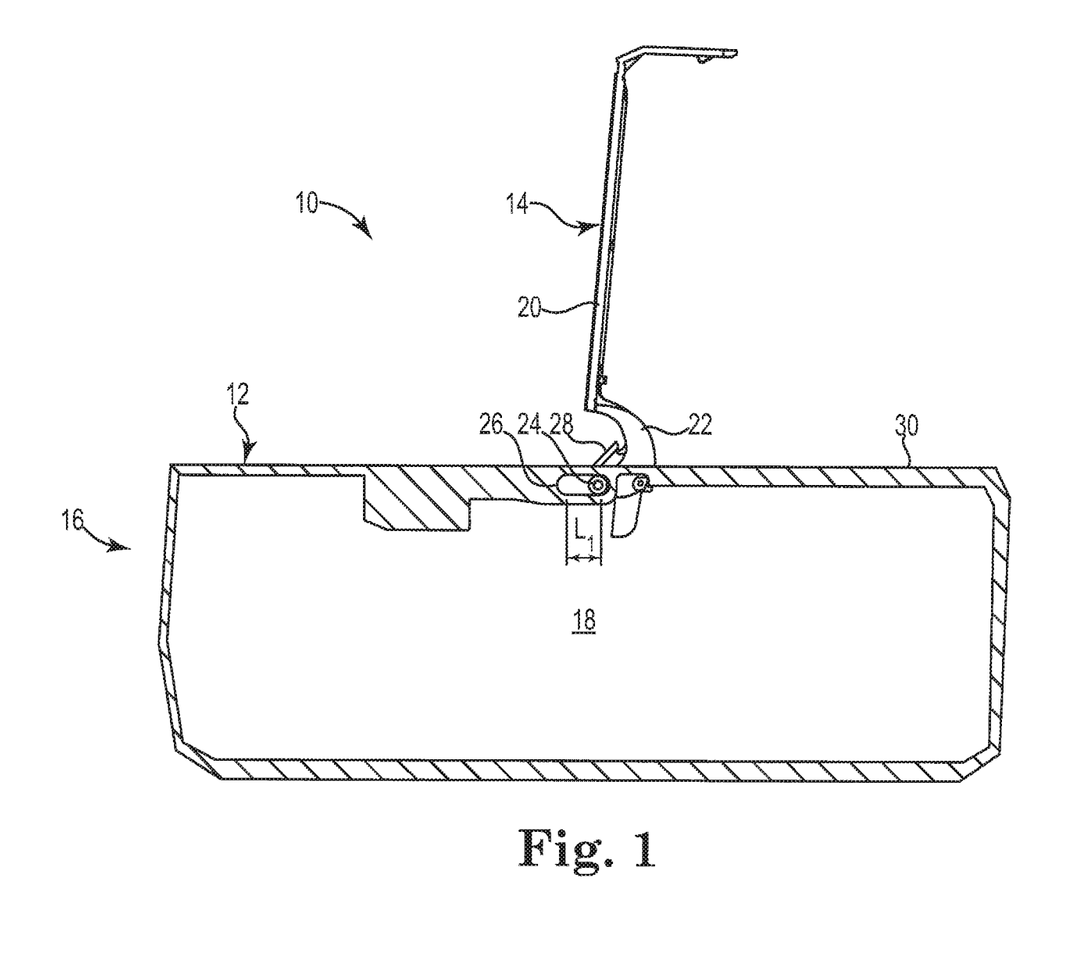
FIG. 1 is a cross-sectional view of an imaging device according to an example of the present disclosure.

FIG. 1 illustrates a cross-sectional view of one example of an imaging device 10 according to the present disclosure. Imaging device 10 (e.g., 2D or 3D printer) includes a housing 12 and an access door 14 to provide access from an exterior 16 of housing 12 to an interior 18 of housing 12 upon operation of access door 14 from a closed position to an open position. FIG. 1 illustrates one example of an access door 14 in an open position. Access door 14 includes a door cover 20 and an arm 22 extending from door cover 20 to couple access door 14 to housing 12. A hinge pin 24 is included on arm 22 to movably cooperate within a slotted boss, or slotted connection, 26 of housing 12. When access of interior 18 portion is desired, such as to replace a component (e.g., ink cartridges), access door 14 can be rotated about hinge pin 24 disposed within slotted boss 26 and translated forward within a length $L_1$ of slotted boss 26. A flap 28 is coupled to housing 12 adjacent to access door 14 and is operable in cooperation with access door 14 as described in greater detail below. Access door 14 and flap 28 can be independently coupled to housing 12.

Figure 2:
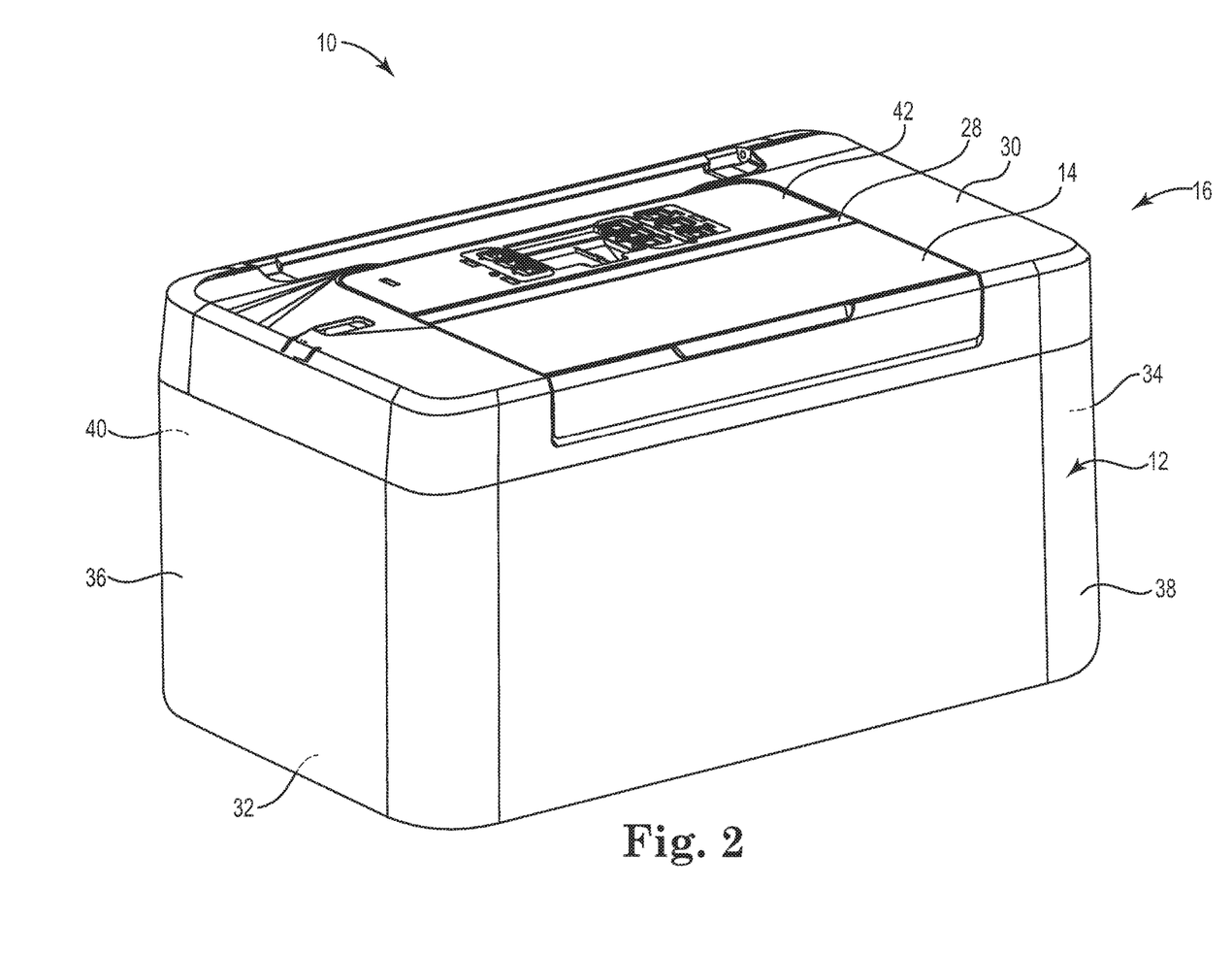
FIG. 2 is a perspective view of an imaging device according to an example of the present disclosure.

FIG. 2 is a perspective view of imaging device 10. Housing 12 includes top 30, a bottom 32, a first side 34, a second side 36, a front 38, and a back 40. Housing 12 can be configured in a generally rectangular shape with top 30 oppositely disposed from bottom 32, second side 36 parallel to and oppositely disposed from first side 34, and front 38 parallel to and oppositely disposed from back 40. In one example, top 30 and bottom 32 of housing 12 are removably coupled together along sides 34, 36, front 38, and back 40. Access door 14 can be positioned on any surface of housing 12 that provides suitable access to components within interior 18 of housing 12. Access door 14 is illustrated on top 30 and front 38 in a closed position in the example imaging device 10 of FIG. 2. Imaging device 10 can include a control panel 42. Control panel 42 can be movable for ease of user viewing and input. Control panel 42 and flap 28 are disposed on a same surface as access door 14 in close relationship to one another to provide a relatively contiguous outer surface with housing 12 when in closed, or lowered, positions. In one example, access door 14, flap 28, and control panel 42 are disposed in parallel and edges of access door 14, flap 28, and control panel 42 are aligned with one another.

Figure 3A:
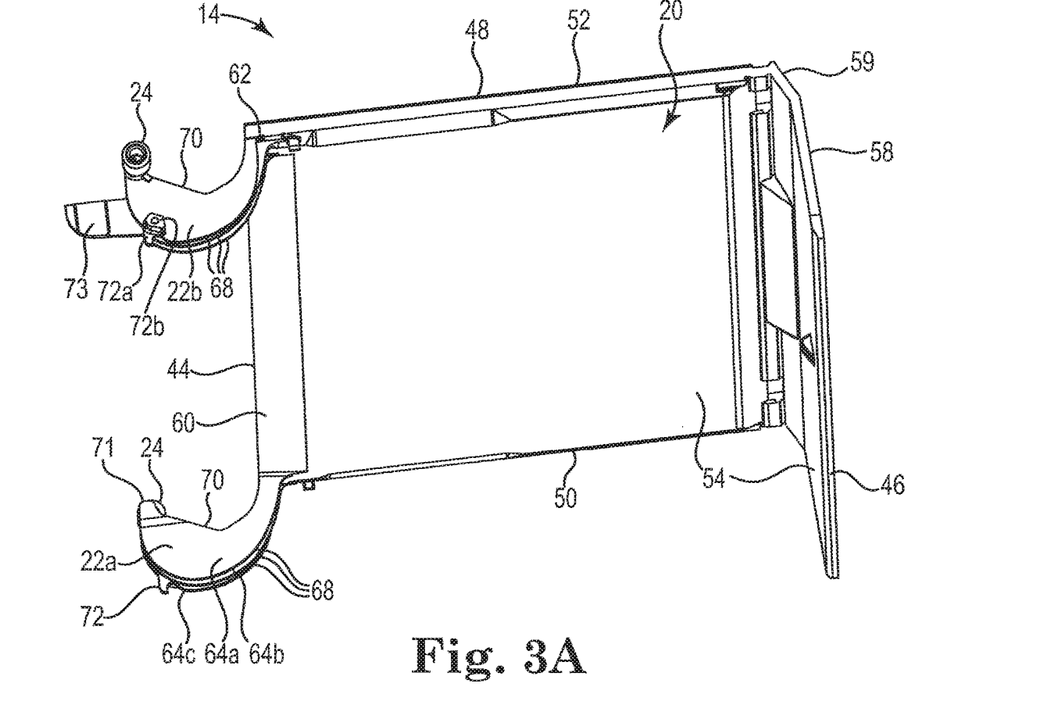
FIGS. 3A and 3B are perspective and bottom views of an access door according to an example of the present disclosure useful in the imaging device of FIG. 2.
Figure 3B:
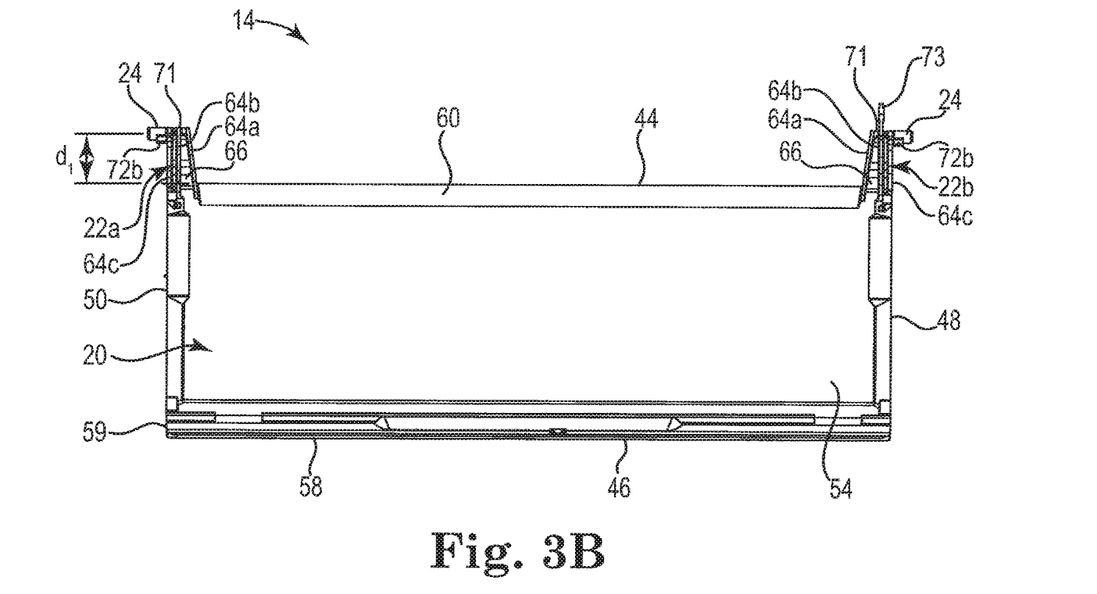

FIGS. 3A and 3B are perspective and bottom views of access door 14 according to one example. In one example, access door 14 includes a pair of arms 22a, 22b extending from door cover 20. Door cover 20 has a back edge 44, a front edge 46, and opposing side edges 48, 50. An exterior door surface 52 and an interior door surface 54 extend between edges 44-50. Door cover 20 generally corresponds to an exterior shape of housing 12 adjacent to which it is disposed. For example, door cover 20 can extend generally planar along a top surface 56 to transition at a substantially right angle (i.e., 90°) from top surface 56 to a front surface 58 to corresponding with top 30 and front 38 of housing 12 in a closed position, as illustrated in FIG. 2. A bend 59 is included to transition door cover 20 from top surface 56 to front surface 58. Door cover 20 can include a tapered area 60 extending from back edge 44 inward along interior door surface 54 between arms 22a, 22b. Interior and exterior door surfaces 54, 52 can vary in shape and form with respect to one another and have varying thickness between them. For example, interior door surface 54 can be indented in select locations to accommodate latches or other components housed within housing 12.

In one example, each two arms 22a, 22b is aligned with opposite side edges 48, 50 of door cover 20. Arms 22a, 22b extend from back edge 44 of door cover 20 in a direction generally away from front edge 46. A first end 62 of each arm 22a, 22b is coupled to door cover 20 extending from interior door surface 54 adjacent back edge 44. Arm 22a, 22b can be formed of inner, middle, and outer segments 64a, 64b, 64c with each segment 64a, 64b, 64c extending from door cover 20 and a transverse web 66 extending and between and connecting segments 64a, 64b, 64c. In one example, outer segment 64c extends in alignment with side edge 48, 50 of door cover 20. Arms 22a, 22b have generally semi-circular outer arm edges 68 and concave inner arm edges 70. In one example, inner arm edges 70 and outer arm edges 68 of segments 64a, 64b, 64c are aligned with on other. In one example, inner arm edges 70 do not correspond to outer arm edges 68 in shape. Arms 22a, 22b can have varied cross-sectional depth between inner arm edges 70 and outer arm edges 68. Inner arm edges 70 can have linear and curved portions to accommodate movement of access door 14 and adjacent components. Inner arm edges 70 and outer arm edges 68 intersect to form a second end 71 of each arm 22 opposite first end 62.

Hinge pin 24 is disposed at second end 71 of each arm 22. In one example, hinge pins 24 project outward and away from outer segments 64c of arms 22 at right angles. Hinge pins 24 can be tubular with an interior suitable to accommodate a leg or end of a spring (not shown). As illustrated in FIG. 3B, hinge pin 24 is positioned a horizontal distance $d_1$ from back edge 44 of door cover 20. Hinge pins 24 can pivotally and slidably attach access door 14 to housing 12, as discussed further below.

A cam detent 72a and a hard stop 72b can be included on at least one arm 22. Cam detent 72a can assist in maintaining access door 14 in an open position and hard stop 72b can prevent over-extension of access door 14 in opening. Hard stop 72b can project outward from arm 22 generally parallel to hinge pin 24. In operation, hard stop 72b contacts a surface of housing 12 upon access door 14 being opened to a predetermined extent. In addition, a flag 73 can extend from arm 22. Flag 73 is fixed to arm 22 and fixedly moves with access door 14 and cooperates with a sensor (not shown) in imaging device 10 to signal open or closed positions of access door 14. In one example, flag 73 extends parallel to top surface 56 in a direction opposite of front surface 58.

Figure 4A:
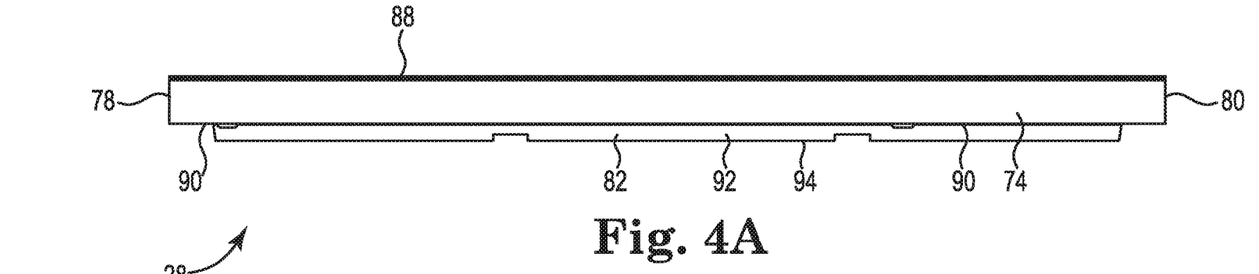
FIGS. 4A-4C are top, bottom and side views of a flap according to an example of the present disclosure useful in the imaging device of FIG. 2.
Figure 4B:
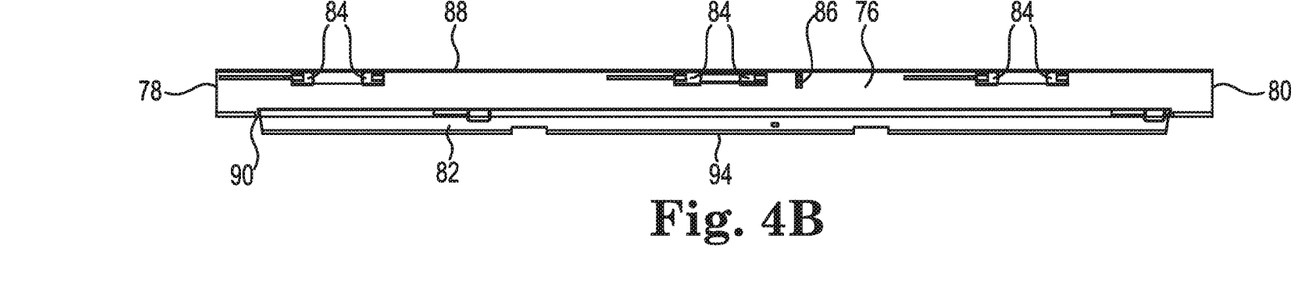
Figure 4C:
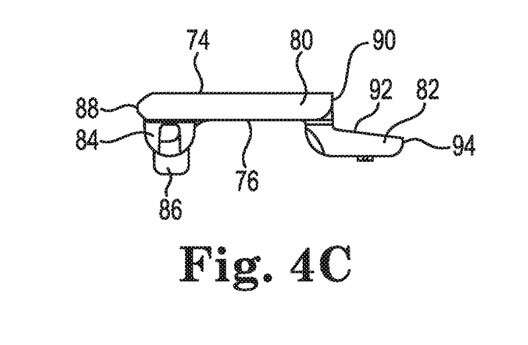

FIGS. 4A-4C illustrate views of flap 28 according to an example of the present disclosure. FIG. 4A illustrates a top surface 74 of flap 28 and FIG. 4B illustrates a bottom surface 76 of flap 28. Top surface 74 and bottom surface 76 extend between opposing side edges 78, 80, a first longitudinal edge 88, and a second longitudinal edge 90. In one example, longitudinal edges 88, 90 have a length equal to a length of back edge 38 of door cover 34. As further illustrated in the side view of FIG. 4C, top surface 74 and bottom surface 76 are generally planar and parallel to one another. A lip 82, hinges 84, and a stop 86 extend from bottom surface 76. Hinges 84 and stop 86 extend adjacent to first longitudinal edge 88 and lip 82 extends outward from second longitudinal edge 90 of flap 18. In one example, three hinges 84 are provided, although other quantities of hinges 84 can also be suitable. Flap 28 is coupled to housing 12 at hinges 84. Hinges 84 can include holes to accommodate ends of springs and can be slotted for ease of assembly of springs with hinges 84. Springs such as torsion springs (not shown) can be included at hinges 84 to bias flap 28 to an opened position. Flap 28 is rotatable along an axis formed along hinges 84. First and second longitudinal edges 88, 90 can be rounded to facilitate ease of rotation of flap 18 along adjacent surfaces. Lip 82 of flap 28 extends adjacent and beyond first longitudinal edge 88. Lip 82 extends generally parallel to top or bottom surface of flap 28. A top 92 of lip 82 can be sloped or tapered toward lip edge 94. Lip 82 has a length suitable to extend between arms 22 when assembled with access door 14.

Figure 5A:
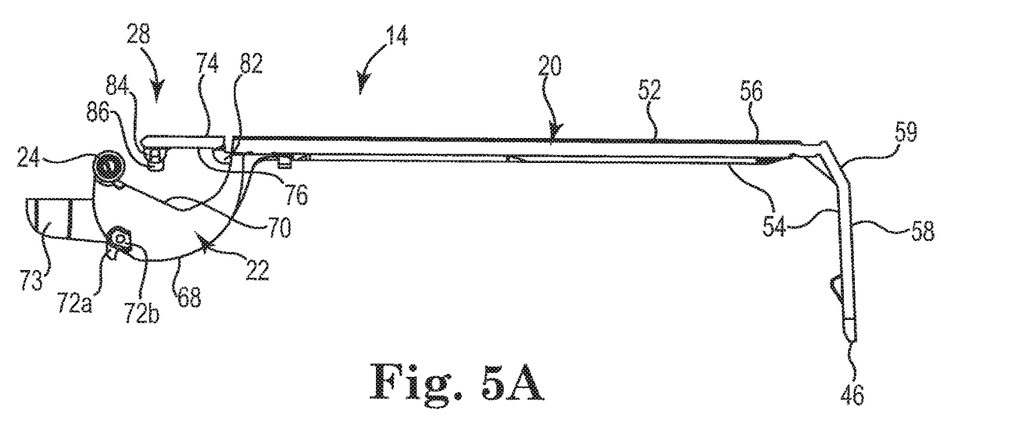
FIG. 5A is a side view of the access door of FIGS. 3A-3B and the flap of FIGS. 4A-4C according to an example of the present disclosure.

FIG. 5A is a side view of access door 14 and flap 28 assembled together according to an example of the present disclosure. Flap 28 extends over at least a portion of arm 22. When assembled, lip 82 is extendable along interior door surface 54 of door cover 20 along back edge 44. Top 92 of lip 82 can be disposed against tapered area 60. Lip 82 extended under door cover 20 retains flap 28 in a closed position while access door 14 is closed. Tapered area 60 can provide additional clearance on the interior of housing 12. As discussed in more detail below, flap 28 can be incrementally or gradually released from the closed position with and as access door 14 is opened, allowing flap 28 to open as access door 14 is opened. Flap 28 pivots about hinges 84 as access door 14 is moved on hinge pins 24. Rotation of flap 28 is dependent on movement of access door 14.

Figure 5B:
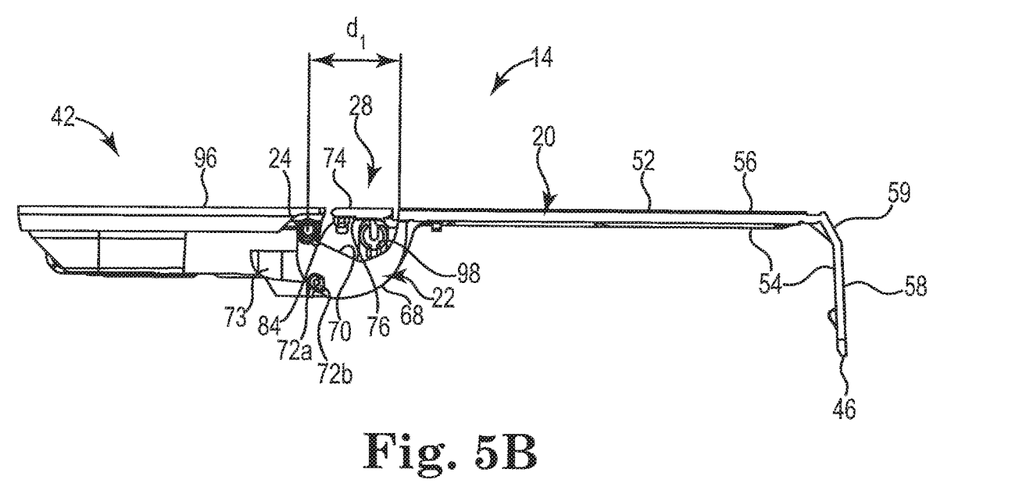
FIG. 5B is a side view of the access door and flap of FIG. 5A and a control panel according to an example of the present disclosure.

FIG. 5B is a side view of access door 14 and flap 28 and control panel 42 according to an example of the present disclosure. Access door 14, flap 28, and control panel 42 are illustrated in FIG. 5B in closed positions. In closed positions, top surface 56 of access door 14, top surface 74 of flap 28, and an upper surface 96 of control panel 42 are aligned and generally planar. Upper surface 96 provides for user interaction and can include a touchscreen input and display with control features of imaging device 10. Control panel 42 can be pivotal about an axis parallel and adjacent to the axis defined by hinges 84 of flap 28. Control panel 42 can be pivotally movable within housing 12 along extensions 98. Control panel 42 is pivotal independent of either flap 28 or access door 14. Flap 28 extends across an interstitial space between control panel 42 and access door 14 when both are in closed positions and aligned with top 30 of housing 12. Distance $d_1$ provides suitable clearance between back edge 44 of door cover 20 and control panel 42 when control panel 42 and access door 14 are both raised, or opened.

Figure 6:
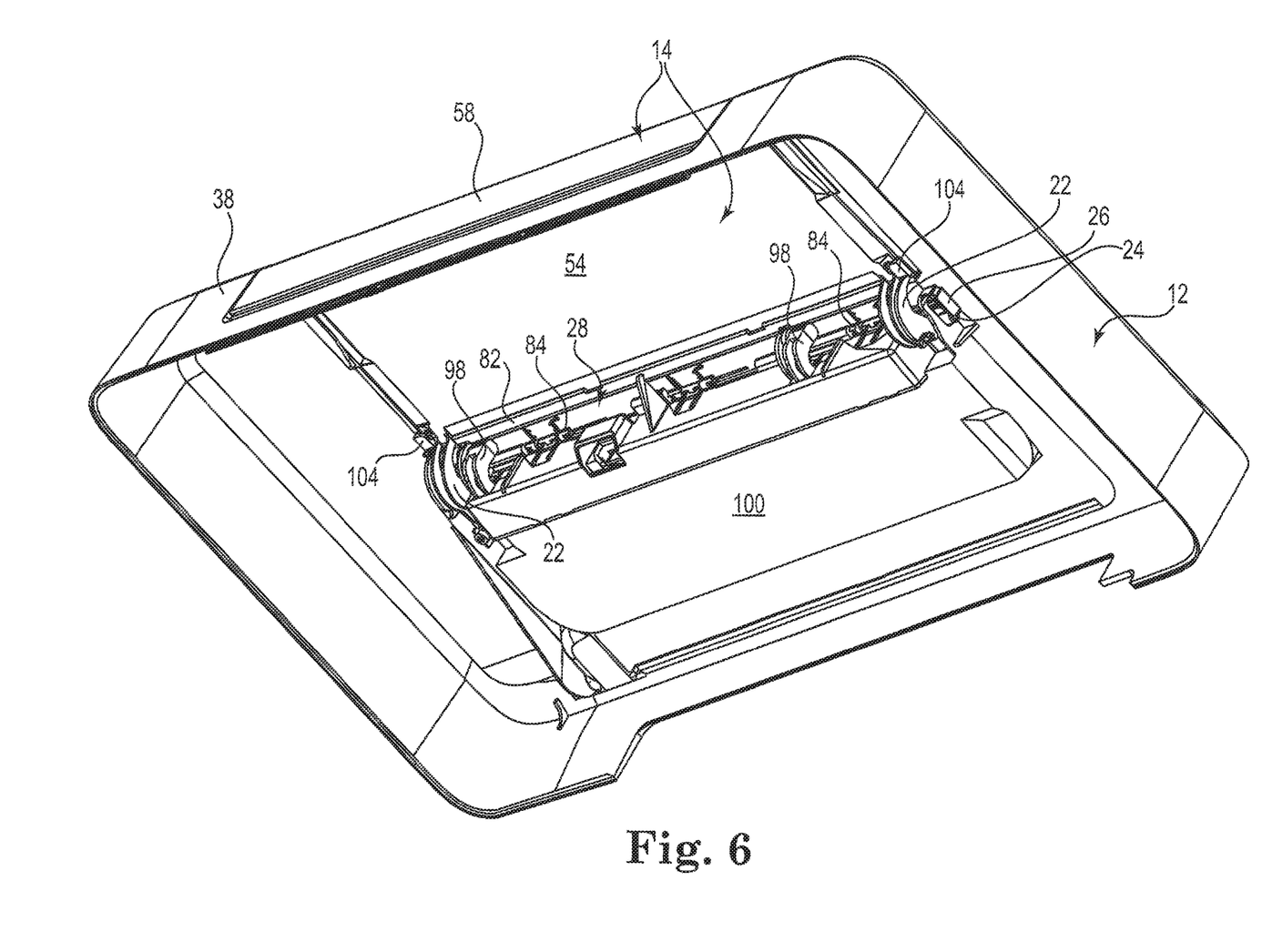
FIG. 6 is an interior perspective of a top of an imaging device according to an example of the present disclosure.

FIG. 6 is an interior perspective of a top of imaging device 10. Housing 12 can include a control panel recess 100 to accommodate control panel 42 in a lowered position. With additional reference to FIG. 2, in a lowered position, control panel 42 is retained in control panel recess 100 such that upper surface 96 is generally flush with top 30 of housing 12. In a raised position, as described further below, control panel 42 can extend upward at an angle from top 30 of housing 12. Control panel 42 can be coupled to and movable with respect to housing 12 by extensions 98.

Access door 14 is connected to housing 12 at slotted bosses 26. Hinge pins 24 are slidably and rotatably disposed in slotted bosses 26. Slotted boss 26 has an opening with a height slightly larger than an outer diameter of hinge pin 24 and a length $L_1$ greater than the outer diameter of hinge pin 24 to provide translating slidable movement of hinge pin 24 within slotted boss 26 (see, e.g., FIG. 1). In one example, slotted boss 26 includes a linear slotted opening, although other configurations can also be suitable. In one example, the opening of slotted boss 26 has a length $L_1$ of approximately 6 mm. Slotted bosses 26 are aligned with one another across access door opening and extend within housing 12 along opposing sides of access door 14. Springs (not shown) are assembled with hinge pins 24 and slotted bosses 26. Springs (e.g., torsion springs) can be biased to move hinge pins 24 forward (i.e., toward front 38) in slotted bosses 26 during opening.

With continued reference to FIG. 6, noses 104 can be included in housing 12 on either side of access door 14 adjacent to arms 22. Noses 104 provide cam follower surfaces for outer connecting segment 64c to be moveable along during opening and closing of access door 14. Cam detent 72a extends from connecting segment 64c to contact nose 104. Hard stops 72b can contact noses 104 when access door 14 is fully open to keep access door 14 from being over extended. Housing 12, access door 14, control panel 42, and flap 28 can be constructed of plastic or other suitable material. For example, housing 12, access door 14, and flap 28 can be constructed of Polycarbonate/Acrylonitrile Butadiene Styrene (PC/ABS) or Acrylonitrile Butadiene Styrene (ABS).

Extensions 98 and arms 22 axially overlap to be movable within adjacent interior space. Extensions 98 and arms 22 are operable in generally opposite directions when opening control panel 42 and access door 14, respectively. Both extensions 98 and arms 22 are rotatable adjacently around the axis formed by hinges 84 of flap 28.

Figure 7A:
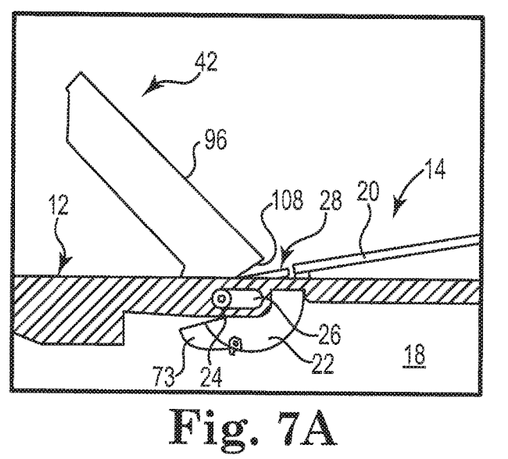
FIGS. 7A-7E are side cross-sectional views of example positions of an access door of an imaging device accordingly to an example of the present disclosure.
Figure 7B:
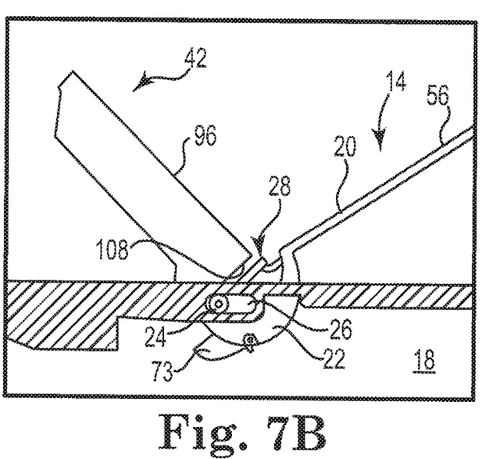
Figure 7C:
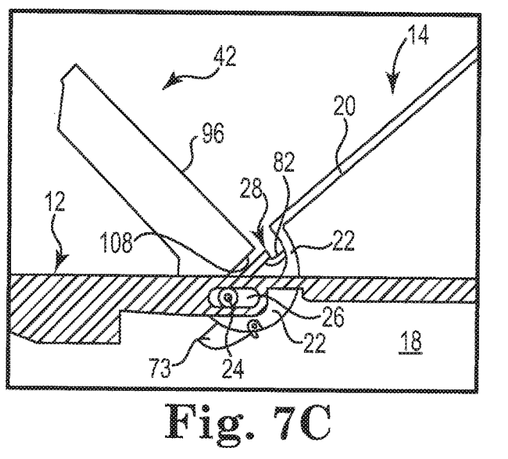
Figure 7D:
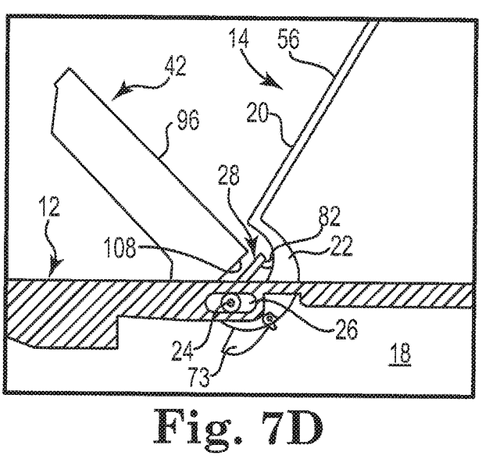
Figure 7E:
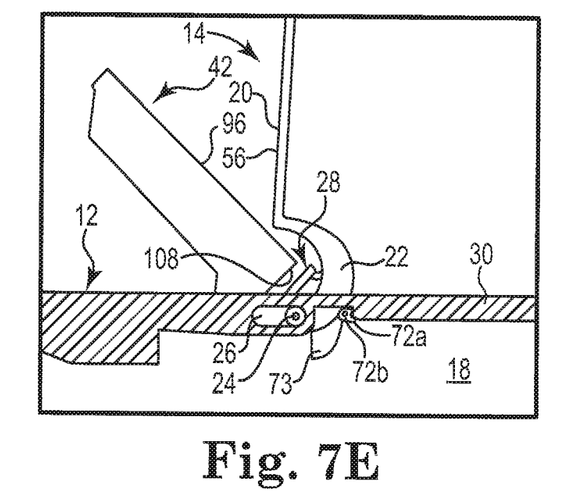

As illustrated in FIGS. 7A-7E, access door 14 can be opened while control panel 42 is in a raised position. Upper surface 96 of control panel 42 and top surface 56 of access panel 14 are movable toward each other. In one example, control panel 42 is rotated approximately 45° from horizontal. In the raised position, control panel 42 extends partially over flap 28. FIG. 7A illustrates access door 14 in a beginning stage of being opened. FIG. 7A illustrates access door 14 rotated open approximately 10°. Hinge pin 24 is positioned at a rear of slotted boss 26 and access door 14 and flap 28 are being rotated about respective axes. Outer arm edges 68 are rotatable against noses 104 extending into the access door opening of housing 12. Opening of access door 14 is progressed to approximately 30° in FIG. 7B. As illustrated, hinge pin 24 has begun to translate forward in slotted boss 26. Flap 28 has been further openingly released by access door 14 and has rotated additionally from the position illustrated in FIG. 7A. Flap 28 can be fully or nearly fully opened in this position and extends below end 108 of control panel 42. In one example, stop 86 of flap 28 contacts an interior surface of housing 12 prior to top surface 74 of flap 28 coming into contact with control panel 42. Lip 82 of flap 28 maintains contact with tapered area 60 of interior door surface 54. FIG. 7C illustrates further opening of access door 14. Hinge pin 24 continues to translate forward in slotted boss 26 as access door 14 is rotated open. FIG. 7D illustrates access door 14 open approximately 60°; hinge pin 24 has translated approximately halfway forward in slotted opening 26. FIG. 7E illustrates access door 14 in an example fully opened position. In the fully opened position of access door 14, hinge pin 24 has been transitioned fully forward in slotted boss 26. The translation of hinge pin 24 along slotted boss 26 provides extended movement and opening of access door 14. In one example, access door 14 has rotated approximately 90° from the closed position when fully open. Arms 22 extend door cover 20 above control panel 42. Flag 73 signals a sensor that access door 14 is opened, and in some examples, ink cartridges are moved to a position suitable for user accessing and replacement.

When access of internal portion is desired, such as to replace a component (e.g., ink cartridges), access door 14 can be rotated about hinge pin 24 and translated forward in slotted boss 26. When rotating access door 14, access door 14 translates forward (i.e., toward front 38) and top surface 56 translates and rotates upward and rearward (i.e., toward back 40). Hard stop 72b can contact an interior, or underside, of top 32 of housing 12 adjacent to nose 104 when access door 14 is fully rotated to prevent over-rotation of access door 14. Cam detent 72a can contact nose 104 when access door is fully open to releasably maintain access door 14 in a fully open position. This pivotal and slidable attachment of access door 14 can enable passage of objects (e.g., a user's hand and a toner cartridge) to and from interior 18 of housing 12.

Figure 8:
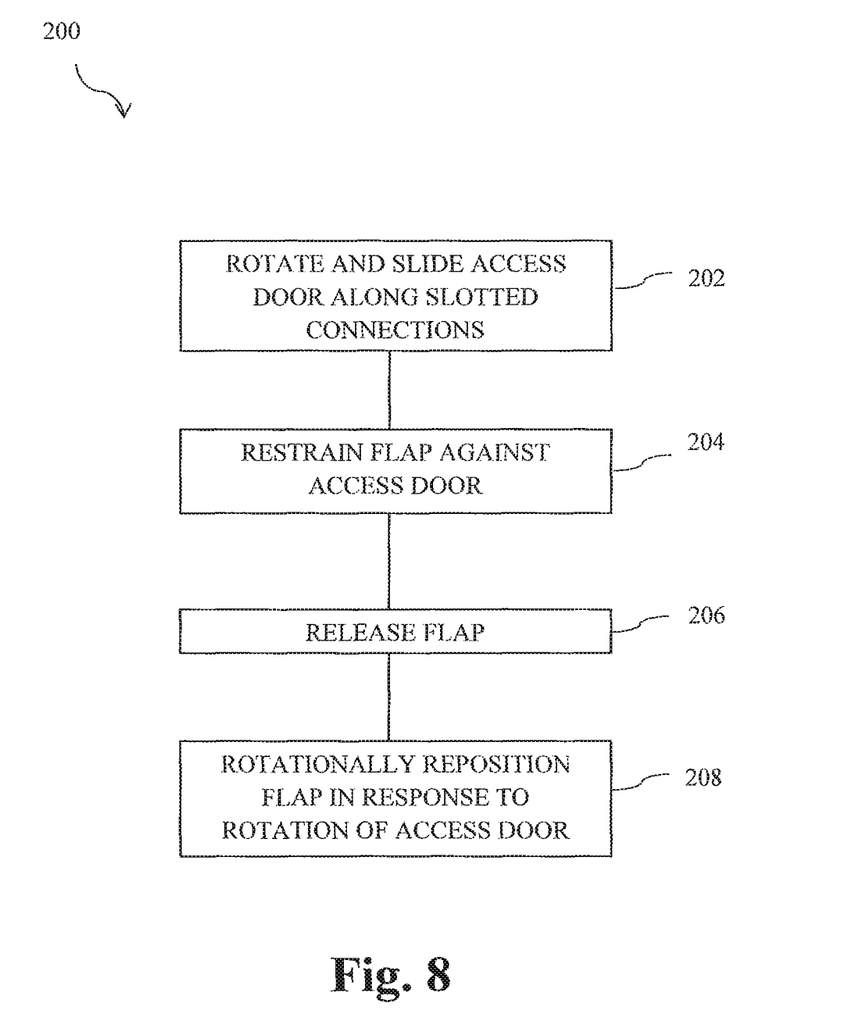
FIG. 8 is a flow chart illustrating an example method for accessing an interior of an imaging device according to an example of the present disclosure.

FIG. 8 is a flow chart illustrating an example method 200 for accessing an interior of an imaging device according to an example of the present disclosure. At 202, an access door having hinge pins is rotated about hinge pins disposed in slotted connections, the hinge pins are rotated and slidably moved along the slotted connections of a housing. At 204, a flap is restrained against an interior side along a first edge of the access door. At 206, the flap is released from a first position extending parallel to and aligned with a top main surface of the access door in response to the access door rotation. At 208, the flap is rotationally repositioned in response to the rotation of the access door.

Although specific examples have been illustrated and described herein, a variety of alternate and/or equivalent implementations may be substituted for the specific examples shown and described without departing from the scope of the present disclosure. This application is intended to cover any adaptations or variations of the specific examples discussed herein. Therefore, it is intended that this disclosure be limited only by the claims and the equivalents thereof.

The invention claimed is:

1. An imaging device, comprising:
    a housing forming an interior, the housing forming an access door opening and a slotted connection on a side of the access door opening;
    an access door including:
        a door cover;
        an arm extending from the door cover; and
        a hinge pin extending outwardly at a terminal end of the arm and matingly coupled with the slotted connections, the hinge pin rotatable and translatable along a length of the slotted connections; and
    a flap rotatably extendable over the arm.

2. The imaging device of claim 1, wherein the slotted connection is linearly slotted.

3. The imaging device of claim 1, comprising:
    a control panel disposed adjacent to the access door with a first edge of the control panel parallel to a first edge of the access door.

4. The imaging device of claim 3, wherein the control panel is movable, wherein a second edge of the control panel opposite the first edge extendable away from the housing at an angle.

5. The imaging device of claim 1, wherein the flap is rotatably coupled to the housing adjacent to a first edge of the door cover.

6. The imaging device of claim 1, wherein a top surface of the flap is planar with a top surface of the door cover in a closed position.

7. The imaging device of claim 1, wherein the door cover is rotatable approximately 90° from a closed position to an open position.

8. The imaging device of claim 1, wherein the flap includes a proximal side adjacent to the door cover in a closed position, and a distal side adjacent to a control panel in a closed position, and wherein the flap further includes a lip disposed on the proximal side to retain the flap in a closed position while the access door is closed.

9. The imaging device of claim 1, wherein the wherein the flap includes a proximal side adjacent to the door cover in a closed position, and a distal side adjacent to a control panel in a closed position, and wherein the flap further includes a stop disposed on the distal side to stop the flap from contacting the control panel.

10. The imaging device of claim 1, wherein the arm includes a stop extending outwardly from the arm and essentially parallel to the hinge pin, the stop to prevent over-extension of the access door.

11. The imaging device of claim 1, wherein the arm includes a flag extending outwardly from the arm and to cooperate with a sensor of the imaging device to signal open or closed positions of the access door.

12. An imaging device, comprising:
a housing having a top, a bottom, and sides defining an interior of the housing, an opening formed on the top and a recess adjacent to the opening;
a door coupled to the housing, the door extending across the opening in a closed position, the door including a door cover and a pair of arms extending away from the door cover, a hinge pin extending from each of the arms to slidably and rotatably move within slots in the housing;
a control panel rotatably disposed in the recess; and
a flap rotatably coupled to the housing, the flap having a first axis of rotation perpendicular with the slots, the flap extendable across a width of the opening between the door cover and the control panel;
wherein top surfaces of the control panel and the door cover are movable toward each other.

13. The imaging device of claim 12, wherein exterior surfaces of the cover, the flap, and the control panel are disposed in a common plane in closed positions.

14. The imaging device of claim 13, wherein the flap is restrained from opening by the door in closed positions.

15. The imaging device of claim 12, wherein the flap and the control panel have an overlapping path of rotation.

16. The imaging device of claim 15, wherein the flap and the control panel are rotatable to extend in opposing directions.

17. A method of accessing an interior of an imaging device, the method comprising:
rotating an access door having hinge pins disposed in slotted connections, the rotating including rotating the access door about the hinge pins, and sliding and rotating the hinge pins along the slotted connections of a housing;
restraining a flap against an interior side along a first edge of the access door;
releasing the flap from a first position extending parallel to and aligned with a top surface of the access door in response to the access door rotation; and
rotationally repositioning the flap in response to the rotation of the access door.

18. The method of claim 17, comprising:
rotating a control panel having an end edge parallel with the first edge of the access door, wherein a second edge of the control panel extends away from an adjacent surface of an imaging device housing at an angle, a second edge of the access door rotatable away from the surface of the imaging device opposite the second edge of the control panel.

19. The method of claim 18, wherein the first edge of the access door extendable above the end edge of control panel in an open position.

* * * * *